(12) United States Patent
Aarskog

(10) Patent No.: US 9,752,404 B2
(45) Date of Patent: Sep. 5, 2017

(54) PRESSURE COMPENSATOR FOR A SUBSEA DEVICE AND MANUFACTURING METHOD

(71) Applicant: Siemens Aktiengesellschaft, München (DE)

(72) Inventor: Fredrik Gundersen Aarskog, Trondheim (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/072,743

(22) Filed: Mar. 17, 2016

(65) Prior Publication Data

US 2016/0281452 A1 Sep. 29, 2016

(30) Foreign Application Priority Data

Mar. 23, 2015 (EP) .................................... 15160332

(51) Int. Cl.
*F16L 55/04* (2006.01)
*E21B 33/035* (2006.01)
*E21B 41/00* (2006.01)
*H01F 27/14* (2006.01)
*H05K 5/06* (2006.01)

(52) U.S. Cl.
CPC ........ *E21B 33/035* (2013.01); *E21B 41/0007* (2013.01); *H01F 27/14* (2013.01); *H05K 5/068* (2013.01); *F15B 2201/22* (2013.01); *F15B 2201/3153* (2013.01); *F16L 55/04* (2013.01)

(58) Field of Classification Search
CPC .... E21B 33/035; E21B 41/0007; H01F 27/14; H05K 5/068; F15B 2201/22; F15B 2201/3153
USPC ......................................................... 166/360
See application file for complete search history.

(56) References Cited

U.S. PATENT DOCUMENTS

| 9,038,433 | B2 | 5/2015 | Skjetne et al. | |
|---|---|---|---|---|
| 2011/0203379 | A1* | 8/2011 | Virtanen | E21B 33/0385 73/708 |
| 2012/0291688 | A1* | 11/2012 | Dawes | B63C 11/00 114/312 |

(Continued)

FOREIGN PATENT DOCUMENTS

| DE | 102013206397 A1 | 10/2014 |
|---|---|---|
| EP | 2610881 B1 | 4/2014 |
| JP | 2015015286 A | 1/2015 |

*Primary Examiner* — Matthew R Buck
*Assistant Examiner* — Patrick Lambe
(74) *Attorney, Agent, or Firm* — Harness, Dickey & Pierce, P.L.C.

(57) ABSTRACT

A pressure compensator for a subsea device is provided. The pressure compensator provides pressure balancing between a chamber of the subsea device and the surrounding environment when the subsea device is installed at a subsea location. The pressure compensator includes an intermediate compensation chamber that is provided by a compensator enclosure. The compensator enclosure is sealed against the subsea environment. The compensator enclosure includes a bellows portion that is deformable to change the volume of the intermediate compensation chamber. The pressure compensator further includes a flexible hose disposed inside the intermediate compensation chamber. A volume inside the flexible hose provides a main compensation chamber.

21 Claims, 2 Drawing Sheets

(56) References Cited

U.S. PATENT DOCUMENTS

2013/0167962 A1\* 7/2013 Skjetne .................. F16L 55/04
138/30

\* cited by examiner

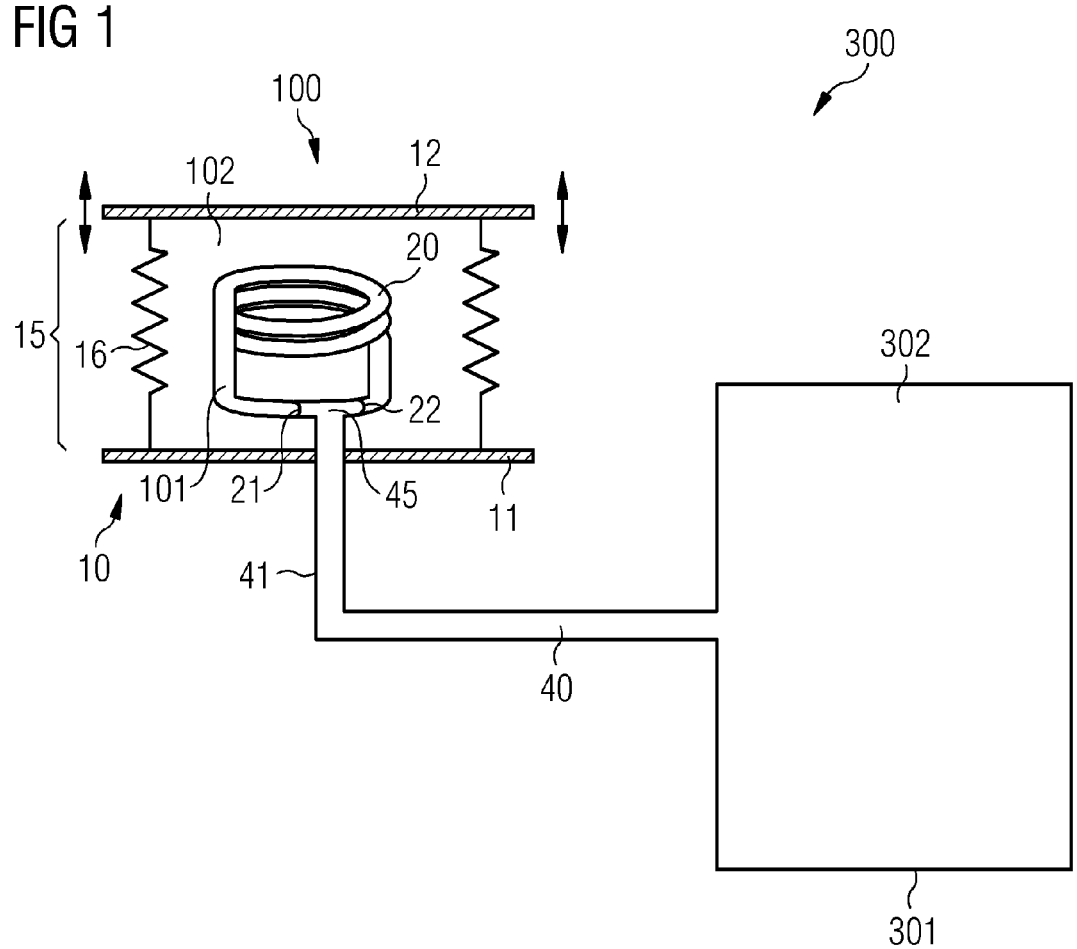

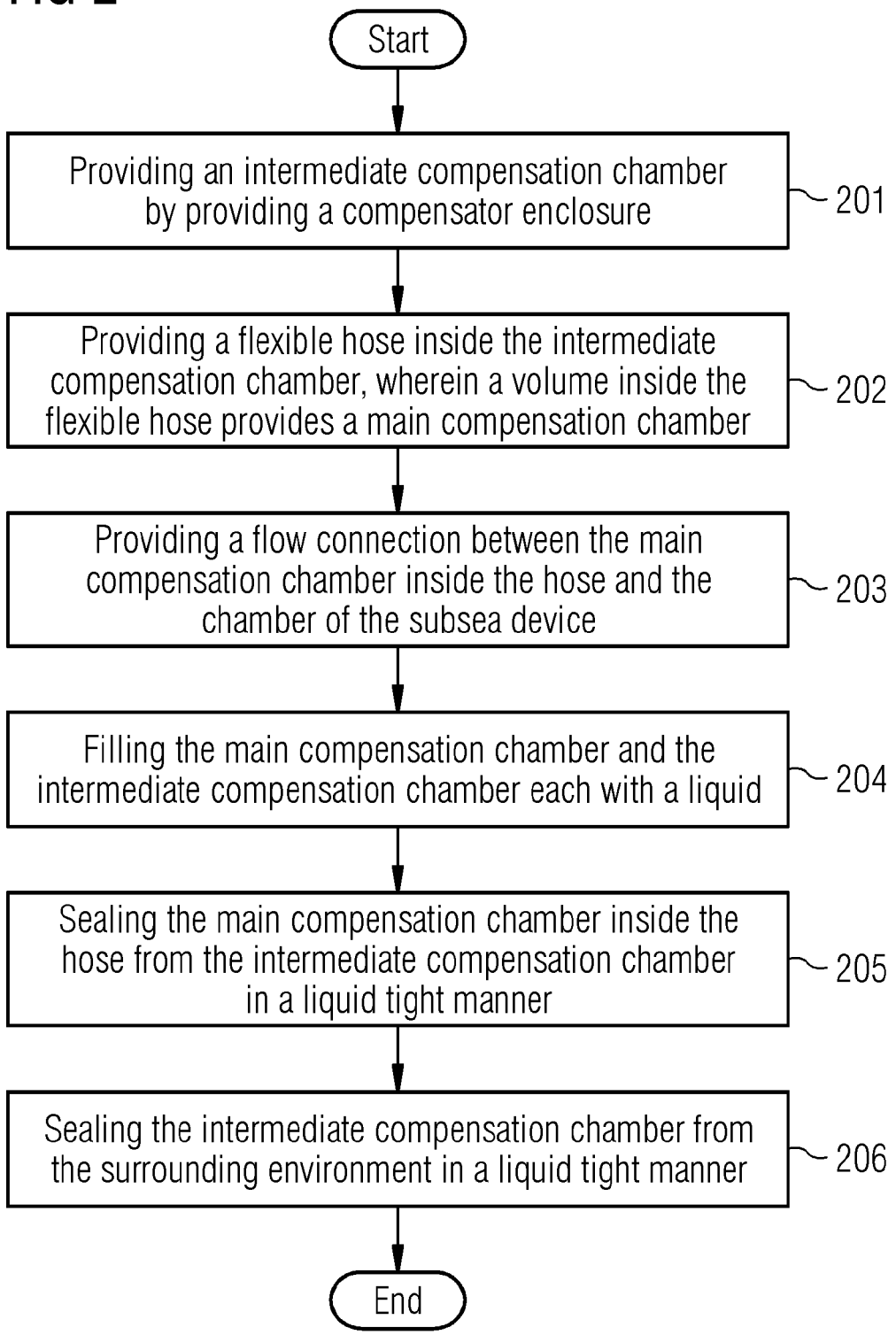

PRESSURE COMPENSATOR FOR A SUBSEA DEVICE AND MANUFACTURING METHOD

PRIORITY STATEMENT

The present application hereby claims priority under 35 U.S.C. §119 to European patent application number EP 15160332.1 filed Mar. 23, 2015, the entire contents of which are hereby incorporated herein by reference.

FIELD

At least one embodiment of the present invention generally relates to a pressure compensator for a subsea device which provides pressure balancing between a chamber of the subsea device and the surrounding environment, and/or to a method of manufacturing such pressure compensator.

BACKGROUND

Traditionally, fixed or floating platforms, or floating production vessels, are used in the offshore oil and gas production. In the operation of offshore platforms, it can be necessary to install electrical equipment under water, e.g. for controlling functions of a subsea Christmas tree or a subsea blowout preventer. More recently, processing facilities are being relocated to the ocean floor. Installations on the ocean floor can comprise a range of components, including pumps, compressors and the like which require electric power for operation. Power supply can occur through a subsea power grid installed on the ocean floor, which may for example comprise a subsea transformer, a subsea switchgear and a subsea variable speed drive for powering the above mentioned subsea loads. It needs to be ensured that the installed equipment operates reliably even under the high pressure that prevails at the rated installation depth which can be 3,000 m or more.

To protect the equipment from the corrosive environment of the surrounding seawater and to deal with the high pressures, two different solutions were proposed. A pressure resistant enclosure can be provided, which has a close to atmospheric internal pressure, enabling the use of conventional electric and electronic components therein. Such enclosures need to have relatively thick walls and are thus bulky and heavy, since they have to withstand high differential pressures.

Another solution is the use of pressurized (or pressure compensated) enclosures, which employ a pressure compensator that balances the pressure in the enclosure to the pressure prevailing in the ambient seawater.

The pressurized enclosure is generally filled with a liquid, and components operated inside the pressurized enclosure are made to be operable under high pressures. The pressure compensator balances the pressure and compensates variations in the volume of the liquid filling the enclosure, which may for example occur due to variations in outside pressure and/or temperature. Temperature changes can also be caused by internal heating, e.g. by electric losses of components provided inside the enclosure of the subsea device. The corresponding volume increase of the liquid filling the enclosure may then be taken up by the pressure compensator, which is thus also termed volume compensator.

Pressure compensators may include bellows, bladders, pistons, membranes or the like. For some types of bellows, such as formed bellows, the stroke length of the bellows can be limited, resulting in a relatively low utilization factor of the volume of the compensator system, and thus in a large 'dead volume'. Furthermore, the liquid filling such pressure compensator needs to be compensated itself (i.e. changes of its volume due to temperature/pressure changes need to be taken up by the compensator). Such compensator systems can thus be relatively large and heavy.

The document EP 2610881 B1 discloses a pressure compensator that reduces the dead volume, i.e. the liquid volume inside the pressure compensator that additionally needs to be compensated.

Other types of bellows may have a smaller dead volume and an increased compensation capacity. Yet such bellows may be more vulnerable to corrosion and leakage. The bellows of a pressure compensator is exposed to the subsea environment, in particular to the seawater. This may cause corrosion problems for the bellows and may lead to the ingress of seawater into the enclosure of the subsea device upon failure of the bellows. Such seawater ingress may lead to a complete failure of the subsea device, e.g. due to short circuit currents or the like.

It is desirable to provide a pressure compensator for use with a subsea device that can be manufactured easily and cost efficiently. It is further desirable that the pressure compensator is reliable during operation and has a long lifetime. It is desirable to reduce the size of pressure compensators, and to increase the utilization factor and compensation capacity. Also, it is desirable that the pressure compensator is protected from corrosion and provides protection against seawater ingress.

SUMMARY

The inventors have discovered that there is a need to provide an improved pressure compensator that obviates at least some of the drawbacks mentioned above.

The claims describe embodiments of the invention.

According to an embodiment, a pressure compensator for a subsea device is provided. The pressure compensator is adapted to provide pressure balancing between a chamber of the subsea device and the surrounding environment when the subsea device is installed at a subsea location. The pressure compensator comprises an intermediate compensation chamber provided by a compensator enclosure that is sealed against the subsea environment. The compensator enclosure comprises a bellows portion that is deformable to change the volume of the intermediate compensation chamber. The pressure compensator further comprises a flexible hose provided inside the intermediate compensation chamber. A volume inside the flexible hose provides a main compensation chamber. A flow connection from the main compensation chamber inside the hose towards the chamber of the subsea device is further provided. The main compensation chamber inside the hose is sealed from the intermediate compensation chamber in a liquid tight manner. The hose is deformable to change the volume of the main compensation chamber to accommodate volume changes of a liquid filling the chamber of the subsea device.

According to a further embodiment of the invention, a method of manufacturing a pressure compensator for a subsea device is provided. The method comprises providing an intermediate compensation chamber by providing a compensator enclosure that is sealed against the subsea environment, wherein the compensator enclosure comprises a bellows portion that is deformable to change the volume of the intermediate compensation chamber. The method further comprises providing a flexible hose inside the intermediate compensation chamber, wherein a volume inside the flexible hose provides a main compensation chamber; providing a flow connection between the main compensation chamber inside the hose and the chamber of the subsea device; and sealing the main compensation chamber inside the hose from the intermediate compensation chamber in a liquid tight manner. The hose is deformable to change the volume of the main compensation chamber to accommodate volume changes of a liquid filling the chamber of the subsea device.

BRIEF DESCRIPTION OF THE DRAWINGS

The foregoing and other features and advantages of the invention will become further apparent from the following detailed description read in conjunction with the accompanying drawings. In the drawings, like reference numerals refer to like elements.

FIG. 1 is a schematic drawing showing a pressure compensator according to an embodiment of the invention.

FIG. 2 is a flow diagram illustrating a method according to an embodiment of the invention.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Further, although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

According to an embodiment, a pressure compensator for a subsea device is provided. The pressure compensator is adapted to provide pressure balancing between a chamber of the subsea device and the surrounding environment when the subsea device is installed at a subsea location. The pressure compensator comprises an intermediate compensation chamber provided by a compensator enclosure that is sealed against the subsea environment. The compensator enclosure comprises a bellows portion that is deformable to change the volume of the intermediate compensation chamber. The pressure compensator further comprises a flexible hose provided inside the intermediate compensation chamber. A volume inside the flexible hose provides a main compensation chamber. A flow connection from the main compensation chamber inside the hose towards the chamber of the subsea device is further provided. The main compensation chamber inside the hose is sealed from the intermediate compensation chamber in a liquid tight manner. The hose is deformable to change the volume of the main compensation chamber to accommodate volume changes of a liquid filling the chamber of the subsea device.

By way of such pressure compensator, an improved life time may be achieved since such flexible hose can be operated over many compensation cycles without damage. Furthermore, the hose has a relative large compensation capacity while having only a relatively low dead volume (i.e. a volume that is not available for the purpose of compensation but needs to be compensated itself). As an example, the volume inside the hose when it is in a non-expanded state (i.e. in a compressed state) can be made relatively small. By providing the hose with a significant flexibility, the volume inside the hose can be expanded considerably, thus providing a large compensation capacity. Furthermore, the compensation capacity can simply be adapted by increasing and decreasing the length of the flexible hose. Also, due to the increased compensation capacity of the hose, the overall size of the pressure compensator can be kept low. This is also due to the fact that the dead volume inside the hose is relative low, so that the additional compensation capacity for such dead volume is also relatively low. A compact pressure compensator having a relatively large compensation capacity and an improved life time may thus be achieved.

In an embodiment, the intermediate compensation chamber and the main compensation chamber are each filled with a dielectric liquid. This may be the same liquid, or different liquids may be used. In particular, the dielectric liquid may be chosen such that it is compatible with the material of the compensator enclosure and the material of the flexible hose (or, the other way around, the respective material may be chosen so as to be compatible with the respective liquid with which it is in contact).

In an embodiment, the compensator enclosure comprises a first end wall and a second end wall located on opposite sides of the compensator enclosure. A side wall is disposed between the first and second end walls, and the bellows portion may be provided on such side wall, i.e. it may form part of the side wall. Accordingly, when the bellows portion contracts or expands, the distance between the opposite end walls changes correspondingly. One end wall may be a fixed end wall that is fixed to an enclosure or support structure of the subsea device, and the other end wall may be a movable end wall that moves with compression and expansion of the bellows portion. The flow connection is preferably provided through such fixed end wall.

In an embodiment, at least part of the compensator enclosure may separate the intermediate compensation chamber from the surrounding seawater when the pressure compensator is installed subsea. As an example, at least the bellows portion and one end wall may be surrounded by seawater when installed subsea.

The flow connection may comprise a pipe section reaching through the compensator enclosure into the intermediate compensation chamber. The flexible hose may be connected to the pipe section. By such pipe section, a reliable and corrosion resistant flow connection between the main compensation chamber and the chamber of the subsea device can be provided. In particular, since it can be made of steel and can be welded to the respective end wall, it is sufficient to provide it with a single outer wall. In other configurations, the flow connection may be provided simply by an opening through an end wall that is located between the pressure compensator and the chamber of the subsea device. Such end wall may also form part of the enclosure of the subsea device.

In an embodiment, the pipe section comprises a three-way junction inside the intermediate compensation chamber. The flexible hose has two ends, and each end is connected to an arm of the three-way junction. The third arm may reach out through an end wall of the compensation enclosure for providing the flow connection to the chamber of the subsea device. An effective flow of liquid through the flow connection into the flexible hose may thus be achieved. In other embodiments, one end of the hose may be closed, and only one end of the hose may be connected to the pipe section to allow the flow of liquid through the pipe section into the main compensation chamber inside the hose. In other embodiments, the flow connection may comprise two pipe sections, and the hose may at each end be connected to one of the two pipe sections. In such configuration, an efficient flow through the hose may be achieved. The liquid may even be pumped through such hose for the purpose of cooling the liquid, e.g. via a pumping device.

The flexible hose may be made from a plastic material or a rubber material, in particular from an elastomeric material. In particular, it can be made from a material that is resistant to seawater. This way, it provides an additional barrier so that upon ingress of seawater into the intermediate compensation chamber, no seawater is leaked into the main compensation chamber and into the subsea device.

The flexible hose may be metalized. It may in particular comprise a thin layer of metal on the outside. Protection against the diffusion of seawater through the material of the hose may thus be improved.

The flexible hose may comprise an internal or external support structure that counteracts a collapsing of the hose. Such support structure may also be configured to prevent an overexpansion of the hose, or an additional structure that may prevent such overexpansion can be provided.

The support structure may comprise a spring, such as a coil string, provided inside the hose. This way, it may be prevented that part of the inner volume inside the hose is disconnected from the flow connection, for example by a bending of a hose leading to a constriction or closure of the interior volume of the hose. Other implementations of the support structure include C-shaped strips distributed along the length of the hose or the like The pressure compensator may further comprise a guiding arrangement for guiding compression and expansion movements of the bellows portion. In particular, it may guide the movement of a movable end wall with respect to the fixed end wall.

As an example, the guiding arrangement may comprise an inner guiding structure provided inside the intermediate compensation chamber. Such inner guiding structure may for example comprise concentrically arranged cylindrical elements that act telescopically and that support the end walls of the pressure compensator against transfers movements perpendicular to the expansion/contraction direction of the bellows portion. In another example, the guiding structure may be provided outside the compensator enclosure. Guiding rods may for example be distributed around the bellows portion. Such guiding rods may for example be fixed on a fixed end wall of the pressure compensator, and a moveable end wall may slidably engage such guiding rods, for example by way of through holes in such end wall through which the guiding rods reach.

The guiding arrangement may furthermore be provided with an expansion and/or compression stop for the bellows portion of the pressure compensator.

According to a further embodiment of the invention, a method of manufacturing a pressure compensator for a subsea device is provided. The method comprises providing an intermediate compensation chamber by providing a compensator enclosure that is sealed against the subsea environment, wherein the compensator enclosure comprises a bellows portion that is deformable to change the volume of the intermediate compensation chamber. The method further comprises providing a flexible hose inside the intermediate compensation chamber, wherein a volume inside the flexible hose provides a main compensation chamber; providing a flow connection between the main compensation chamber inside the hose and the chamber of the subsea device; and sealing the main compensation chamber inside the hose from the intermediate compensation chamber in a liquid tight manner. The hose is deformable to change the volume of the main compensation chamber to accommodate volume changes of a liquid filling the chamber of the subsea device.

By way of such method, a pressure compensator that has advantages similar to the ones outlined further above may be obtained.

In embodiments of the method, the method may be performed so as to obtain a pressure compensator in any of the above outlined configurations.

It is to be understood that the features mentioned above and those yet to be explained below can be used not only in the respective combinations indicated, but also in other combinations or in isolation without leading the scope of the present invention.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

FIG. 1 schematically illustrates a subsea device 300 having a subsea enclosure 301 which encloses a chamber 302. Subsea device 300 may for example be a subsea transformer, a subsea converter, in particular a subsea variable speed drive, a subsea switchgear, a subsea motor, a subsea control and/or communication module or the like. Accordingly, respective mechanical, electric and/or electronic components may be disposed in the chamber 302. Chamber 302 is pressure compensated via pressure compensator 100. It should be clear that subsea device 300 may comprise one or more pressure compensated chambers, and may additionally comprise one or more chambers in which a predetermined pressure is maintained (pressure resistant chambers), for example a close to atmospheric pressure (e.g. below 10 bar or 5 bar, e.g. about 1.5 bar). Accordingly, some components which may not be operable under the high subsea pressures may be placed in a pressure resistant enclosure inside the chamber 302, or adjacent thereto, or the like.

The pressure compensator 100 includes a compensator enclosure 10 that has a fixed end wall 11, a moveable end wall 12 and a side wall 15. The side wall 15 has a cylindrical shape and is sealed to the end walls 11, 12. The side wall 15 has a bellows portion 16 that can contract and expand. Upon such contraction or expansion, moveable end wall 12 is moved downwards or upwards, respectively, in the configuration of FIG. 1. Accordingly, the volume enclosed by the compensator enclosure 10 changes. Compensator enclosure 10 defines an intermediate compensation chamber 102. Inside the intermediate compensation chamber 102, a flexible tube 20 is disposed. The volume inside the flexible tube 20 defines a main compensation chamber 101. By way of the flow connection 40, the main compensation chamber 101 is in flow communication with the chamber 302 of subsea device 300. The main compensation chamber 101 is sealed to the intermediate compensation chamber 102 in a liquid tight manner.

The flow connection 40 can for example be provided by a pipe section 41 that reaches from the device chamber 302 through an end wall of pressure compensator 100 into the intermediate compensation chamber 102, where it is connected to the flexible hose 20. Flexible hose 20 may have one open end connected to the pipe section 41 and sealed thereto, and a closed end at which the flexible hose 20 is closed. In the configuration of FIG. 1, the pipe section 41 comprises a tree-way junction 45 having two arms within the intermediate compensation chamber 102. The flexible hose 20 has two open ends 21, 22, each of which is connected to an arm of the tree-way junction 45 and sealed thereto. Flow into and out of the main compensation chamber 101 may thus be improved.

As can be seen from FIG. 1, liquid filling the main compensation chamber 101 and the chamber 302 can flow between these two chambers via the flow connection 40. It should be clear that the flow connection 40 can be provided in different configurations, for example in form of a short pipe section between an end of hose 20 and chamber 302, for example when the fixed end wall 11 is directly disposed on the enclosure 301 of subsea device 300.

Other configurations are certainly conceivable. As an example, the flow connection 40 may comprise two pipe sections reaching into the intermediate chamber 102, the hose 20 being at each end connected to a different of these two pipe sections.

In operation, liquid filling chamber 302 can flow into and out of the flexible hose 20. As an example, if the volume of the liquid filling chamber 302 is increased, for example due to heating by operation of electric or electronic components, the additional volume can be accommodated by a flow of liquid through flow connection 40 into the flexible hose 20. Flexible hose 20 accordingly expands to take up the additional liquid. Due to the volume increase of flexible hose 20, the volume inside the intermediate compensation chamber 102 is also increased, resulting in an expansion of the bellows portion 16 to accommodate the additional volume. Similarly, when the volume of the liquid filling chamber 302 becomes smaller, for example due to cooling of the liquid, liquid can flow out of the hose 20 via flow connection 40 into the chamber 302 to accommodate the volume change. In this case, the volume of hose 20 decreases, and thus the volume inside the intermediate compensation chamber 102 decreases. Accordingly, bellows portion 16 contracts, resulting in a movement of the moveable end wall 12 towards the fixed end wall 11.

A very effective compensation of volume changes of the liquid filling chamber 103 can thus be achieved. A build up of under-pressure or over-pressure inside chamber 302 can be prevented, with pressure compensator 100 providing a pressure balancing between the high pressure subsea environment around the subsea device 301 and the inside of chamber 302. Furthermore, by providing the intermediate compensation chamber 102, a double barrier against the ingress of seawater into chamber 302 is provided. Generally, components that are moving or deforming, such as the bellows portion 16, are prone to leakage after a certain time in operation. By providing the flexible hose 20 inside the intermediate compensation chamber 201, leakage of seawater into the main compensation chamber 101 can be prevented upon failure of the bellows portion 16.

Furthermore, the flexible hose 20 can provide a significant compensation capacity. Flexible hose 20 may be made with a relatively small interior volume, and with a relatively large expansion capability. Accordingly, the volume inside the flexible hose 20 may be capable of at least doubling or tripling its size. Furthermore, the length of the hose 20 can be changed to adjust the compensation capacity in the main compensation chamber 101.

To provide the flexible hose 20 with a certain stability and to prevent a collapse of the flexible hose 20, which may for example be due to excessive bending and may result in a section of the hose being cut off from the flow communication, an internal or external support structure can be provided for the flexible hose 20 (not shown). Such support structure can for example comprise a coil spring that is arranged inside or outside the flexible hose 20. Another example are C-rings (i.e. open rings) that can be provided in the wall of the flexible hose 20 and the diameter of which can change with an expansion or contraction of the flexible hose 20.

The pressure compensator 100 may be provided as a separate entity, or it may form part of the subsea device 300.

Dielectric liquid fills the main compensation chamber 101 and the intermediate compensation chamber 102. Such dielectric liquid may for example be an oil. In some embodiments, it may be an ester-based liquid. In particular, a liquid such as Midel may be used.

FIG. 2 illustrates a flow diagram of a method according to an embodiment of the invention. By such method, a pressure compensator in any of the above outlined configurations may be manufactured. In step 201, an intermediate compensation chamber is provided by providing a compensator enclosure, such as the enclosure 10, that is sealed against the subsea environment. In step 202, a flexible hose is provided inside the intermediate compensation chamber. The volume inside the flexible hose provides a main compensation chamber.

In step 203, a flow connection between the main compensation chamber inside the hose and the chamber of the subsea device is provided. The flow connection may for example be provided by welding or otherwise sealing a pipe section to a wall of the compensator enclosure 10 and to the wall of the subsea enclosure 301 of the subsea device 300. The flexible hose can then be sealed to the end of the pipe section that is located within the intermediate compensation chamber 102.

In step 204, the main compensation chamber and the intermediate compensation chamber are each filled with a liquid. This may be the same liquids or different liquids. Preferably, the liquid inside the main compensation chamber 101 is the same as the liquid filling the chamber 302 of the subsea device 300.

The flexible hose 20 is preferably made of a material that is resistant to seawater, and that is furthermore compatible with the liquid filling the main compensation chamber 101 and the intermediate compensation chamber 102. Such material may for example be rubber or plastic material. In particular, a polymer material or elastomeric material is used. The method may optionally comprise the step of metalizing the flexible hose 20. In particular, a thin layer of metal may be applied to the hose. In this way, water dissipation properties of the hose may be improved, and water diffusion through the hose material may be prevented.

The bellows portion 16 may similarly be made of a material that is resistant to seawater and that is compatible with the liquid filling the intermediate compensation chamber 102. The bellows portion may for example be made of metal, in particular steel, or of rubber. Metal has the advantage that seawater can essentially not diffuse therethrough, while rubber has the advantage that it is corrosion resistant.

In step 205, the main compensation chamber inside the hose is sealed from the intermediate compensation chamber in a liquid tight manner. This may for example be achieved by sealing the flexible hose 20 to the pipe section 41, and by sealing the port through which the liquid is filled into the main compensation chamber 101. Liquid may also be filled into the main compensation chamber through the flow connection 40. In step 206, the intermediate compensation chamber is sealed from the surrounding environment in a liquid tight manner. This may for example be achieved by welding or bolting the side wall 15 to the first and second end walls 11, 12 and the by sealing of a fill port through which the liquid is filled into the intermediate compensation chamber 102.

It should be clear that the method steps described above may be performed in a different order.

By such method, a pressure compensator as described with respect to FIG. 1 may be obtained. The method may comprise further steps for obtaining any of the above outlined configurations, for example the step of placing a support structure into the flexible hose 20, or connecting both ends of the flexible hose to the arms of a tree-way junction of the pipe section 41.

While specific embodiments are disclosed herein, various changes and modifications can be made without departing from the scope of the invention. The present embodiments are to be considered in all respects as illustrative in non-restrictive, and all changes coming within the meaning and equivalency range of the appended claims are intended to be embraced therein.

The aforementioned description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods. Further, elements and/or features of different example embodiments may be combined with each other and/or substituted for each other within the scope of this disclosure and appended claims.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Still further, any one of the above-described and other example features of the present invention may be embodied in the form of an apparatus, method, system, etc. For example, of the aforementioned methods may be embodied in the form of a system or device, including, but not limited to, any of the structure for performing the methodology illustrated in the drawings.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

None of the elements recited in the claims are intended to be a means-plus-function element within the meaning of 35 U.S.C. §112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A pressure compensator for a subsea device, the pressure compensator providing pressure balancing between a chamber of the subsea device and the surrounding environment when the subsea device is installed at a subsea location, the pressure compensator comprising:
   an intermediate compensation chamber, provided by a compensator enclosure sealed against the subsea environment, the compensator enclosure including a bellows portion deformable to change a volume of the intermediate compensation chamber;
   a flexible hose, disposed inside the intermediate compensation chamber, a volume inside the flexible hose between two open ends of the flexible hose providing a main compensation chamber; and
   a flow connection from between the main compensation chamber inside the flexible hose and the chamber of the subsea device, wherein the main compensation chamber inside the flexible hose is sealed from the intermediate compensation chamber in a liquid tight manner, and wherein the flexible hose is deformable to change the volume of the main compensation chamber to accommodate volume changes of a liquid contained in the chamber of the subsea device.

2. The pressure compensator of claim 1, wherein the intermediate compensation chamber and the main compensation chamber are each filled with a dielectric liquid.

3. The pressure compensator of claim 2, wherein the compensator enclosure comprises a first end wall and a second end wall located on opposite sides of the compensator enclosure, wherein a side wall is disposed between the first and second end walls, the side wall including said bellows portion.

4. The pressure compensator of claim 2, wherein at least part of the compensator enclosure separates the intermediate compensation chamber from surrounding seawater when the pressure compensator is installed subsea.

5. The pressure compensator of claim 2, wherein the flow connection includes a pipe section reaching through the compensator enclosure into the intermediate compensation chamber, the flexible hose being connected to the pipe section.

6. The pressure compensator of claim 2, wherein the flexible hose is made from a plastic material or a rubber material.

7. The pressure compensator of claim 1, wherein the compensator enclosure comprises a first end wall and a second end wall located on opposite sides of the compensator enclosure, wherein a side wall is disposed between the first and second end walls, the side wall including said bellows portion.

8. The pressure compensator of claim 1, wherein at least part of the compensator enclosure separates the intermediate compensation chamber from surrounding seawater when the pressure compensator is installed subsea.

9. The pressure compensator of claim 1, wherein the flow connection includes a pipe section reaching through the compensator enclosure into the intermediate compensation chamber, the flexible hose being directly connected to the pipe section.

10. The pressure compensator of claim 9, wherein the pipe section includes a three way junction inside the intermediate compensation chamber, each of the two ends being respectively being connected to an arm of the three way junction.

11. The pressure compensator of claim 1, wherein the flexible hose is made from a plastic material or a rubber material.

12. The pressure compensator of claim 11, wherein the flexible hose is made from an elastomeric material.

13. The pressure compensator of claim 1, wherein the flexible hose is metalized.

14. The pressure compensator of claim 1, wherein the flexible hose includes an internal or external support structure that counteracts a collapsing of the hose.

15. The pressure compensator of claim 14, wherein the support structure comprises a spring, provided inside the flexible hose.

16. The pressure compensator of claim 15, wherein the support structure comprises a coil spring, provided inside the flexible hose.

17. The pressure compensator of claim 1, further comprising a guiding arrangement for guiding compression/expansion movements of the bellows portion.

18. The pressure compensator of claim 17, wherein the guiding arrangement includes an inner guiding structure provided inside the intermediate compensation chamber or an external guiding structure provided outside the compensator enclosure.

19. The pressure compensator of claim 18, wherein the guiding arrangement includes guiding rods distributed around the bellows portion.

20. A method of manufacturing a pressure compensator for a subsea device, the pressure compensator providing pressure balancing between a chamber of the subsea device and the surrounding environment when the subsea device is installed at a subsea location, the method comprising:
   providing an intermediate compensation chamber by providing a compensator enclosure, sealed against the subsea environment, the compensator enclosure including a bellows portion that is deformable to change the volume of the intermediate compensation chamber;
   providing a flexible hose inside the intermediate compensation chamber, wherein a volume inside the flexible hose between two open ends of the flexible hose provides a main compensation chamber;
   providing a flow connection between the main compensation chamber inside the flexible hose and the chamber of the subsea device; and
   sealing the main compensation chamber inside the flexible hose from the intermediate compensation chamber in a liquid tight manner, the flexible hose being deformable to change the volume of the main compensation chamber to accommodate volume changes of a liquid contained in the chamber of the subsea device.

21. The method of claim 20, wherein the method is performed so as to manufacture a pressure compensator.

* * * * *